(12) United States Patent
Richter et al.

(10) Patent No.: US 9,922,907 B2
(45) Date of Patent: Mar. 20, 2018

(54) ELECTRONIC COMPONENT, LEADFRAME, AND METHOD FOR PRODUCING AN ELECTRONIC COMPONENT

(71) Applicant: OSRAM Opto Semiconductors GmbH, Regensburg (DE)

(72) Inventors: Daniel Richter, Bad Abbach (DE); MIchael Zitzlsperger, Regensburg (DE); Christian Ziereis, Lappersdorf (DE); Stefan Gruber, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/327,009

(22) PCT Filed: Jul. 14, 2015

(86) PCT No.: PCT/EP2015/066081
§ 371 (c)(1),
(2) Date: Jan. 17, 2017

(87) PCT Pub. No.: WO2016/008893
PCT Pub. Date: Jan. 21, 2016

(65) Prior Publication Data
US 2017/0179353 A1 Jun. 22, 2017

(30) Foreign Application Priority Data

Jul. 17, 2014 (DE) .................. 10 2014 110 074

(51) Int. Cl.
*H01L 23/495* (2006.01)
*H01L 33/62* (2010.01)
(Continued)

(52) U.S. Cl.
CPC .... *H01L 23/49541* (2013.01); *H01L 23/4951* (2013.01); *H01L 23/49503* (2013.01);
(Continued)

(58) Field of Classification Search
CPC ......... H01L 33/48; H01L 33/52; H01L 33/54; H01L 33/62; H01L 23/26; H01L 23/31; H01L 23/3121; H01L 23/495; H01L 23/49503; H01L 23/4951; H01L 23/49541; H01L 23/49575
See application file for complete search history.

(56) References Cited

U.S. PATENT DOCUMENTS

2008/0041625 A1* 2/2008 Cheong .................. H01L 33/60
174/521
2008/0157309 A1 7/2008 Hojo
(Continued)

*Primary Examiner* — Eduardo A Rodela
(74) *Attorney, Agent, or Firm* — Slater Matsil, LLP

(57) ABSTRACT

An electronic component, a leadframe, and a method for producing an electronic component are disclosed. In an embodiment, the electronic component includes a housing and a leadframe section partly embedded in the housing, wherein the leadframe section includes a first quadrant, a second quadrant, a third quadrant and a fourth quadrant, wherein each of the quadrants has a first leadframe part and a second leadframe part, wherein each first leadframe part includes a chip landing area, wherein the chip landing areas of all four quadrants are arranged adjacently to a common central region of the leadframe section, and wherein the four quadrants are configured symmetrically with respect to one another.

12 Claims, 5 Drawing Sheets

(51) Int. Cl.
  *H01L 25/075* (2006.01)
  *H01L 25/16* (2006.01)
  *H01L 27/02* (2006.01)
  *H01L 33/48* (2010.01)

(52) U.S. Cl.
  CPC ........ *H01L 25/0753* (2013.01); *H01L 25/167* (2013.01); *H01L 27/0248* (2013.01); *H01L 33/486* (2013.01); *H01L 33/62* (2013.01); *H01L 23/49575* (2013.01)

(56) References Cited

U.S. PATENT DOCUMENTS

| | | | |
|---|---|---|---|
| 2008/0179618 A1 | 7/2008 | Cheng | |
| 2008/0296590 A1* | 12/2008 | Ng | H01L 33/486 257/88 |
| 2009/0109668 A1 | 4/2009 | Isobe | |
| 2009/0289275 A1* | 11/2009 | Hayashi | B29C 45/0025 257/99 |
| 2010/0117099 A1 | 5/2010 | Leung | |
| 2011/0186875 A1* | 8/2011 | Egoshi | H01L 24/97 257/89 |
| 2013/0049564 A1 | 2/2013 | Jung et al. | |
| 2014/0049165 A1* | 2/2014 | Sogabe | H01L 33/62 315/151 |
| 2014/0103375 A1* | 4/2014 | Kobayakawa | H01L 33/483 257/91 |

* cited by examiner

ELECTRONIC COMPONENT, LEADFRAME, AND METHOD FOR PRODUCING AN ELECTRONIC COMPONENT

This patent application is a national phase filing under section 371 of PCT/EP2015/066081, filed Jul. 14, 2015, which claims the priority of German patent application 10 2014 110 074.3, filed Jul. 17, 2014, each of which is incorporated herein by reference in its entirety.

TECHNICAL FIELD

The present invention relates to an electronic component, a leadframe, and a method for producing an electronic component.

BACKGROUND

Electronic components comprising a housing with an embedded leadframe are known from the prior art. In particular, corresponding optoelectronic components are known, for example, light emitting diode components. In the case of such electronic components, the leadframe embedded into the housing serves for electrically contacting an electronic semiconductor chip of the electronic component, and for dissipating waste heat produced in the electronic semiconductor chip during the operation of the electronic component. Electronic components comprising more than one electronic semiconductor chip are also known.

SUMMARY OF THE INVENTION

Embodiments of the present invention provide an electronic component. Further embodiments provide a leadframe for an electronic component. Yet other embodiments provide a method for producing an electronic component. Various embodiments provide an electronic component comprises a housing and a leadframe section partly embedded into the housing. The leadframe section comprises a first quadrant, a second quadrant, a third quadrant and a fourth quadrant. Each of the quadrants comprises a first leadframe part and a second leadframe part. Each first leadframe part comprises a chip landing area. The chip landing areas of all four quadrants are arranged adjacently to a common central region of the leadframe section. Advantageously, the chip landing areas of the four quadrants of the leadframe section embedded into the housing of this electronic component are thus arranged very close to one another. This makes it possible for electronic semiconductor chips of the electronic component that are arranged on the chip landing areas of the leadframe section also to be arranged very close to one another.

In one embodiment of the electronic component, the four quadrants are configured symmetrically with respect to one another. Advantageously, this results in a simple and regular geometry of the leadframe section embedded into the housing of the electronic component. In this case, the leadframe parts of each quadrant of the leadframe section have the same size, as a result of which similar or identical conditions arise for electronic semiconductor chips arranged on the chip landing areas of the leadframe parts of the individual quadrants. The symmetrical configuration of the four quadrants of the leadframe section of the electronic component additionally simplifies mounting of the electronic component. In this case, the mutually symmetrical configuration of the quadrants of the leadframe section of the electronic component may enable, in particular, a self-alignment of the electronic component during the mounting of the electronic component.

In one embodiment of the electronic component, the four quadrants are configured rotationally symmetrically with respect to one another. Advantageously, this enables a uniform configuration of the leadframe parts of all quadrants of the leadframe section of the electronic component, without a mirror-symmetrical configuration of the quadrants of the leadframe section being required. Mechanical weak points of the leadframe section which are formed at mirror axes may be avoided as a result.

In one embodiment of the electronic component, all leadframe parts of all four quadrants are electrically isolated from one another. This makes it possible for four electronic semiconductor chips to be driven separately from one another via the leadframe parts of the four quadrants of the leadframe section embedded into the housing of the electronic component.

In one embodiment of the electronic component, the chip landing area of each first leadframe part comprises a first outer edge and a second outer edge. In this case, the first outer edge of the first leadframe part of the first quadrant is arranged parallel and directly adjacently to the second outer edge of the first leadframe part of the second quadrant. The second outer edge of the first leadframe part of the first quadrant is arranged parallel and directly adjacently to the first outer edge of the first leadframe part of the fourth quadrant. Advantageously, this results in a particularly compact and space-saving arrangement of the chip landing areas of the first leadframe parts of the four quadrants of the leadframe section of the electronic component.

In one embodiment of the electronic component, in each case an electronic semiconductor chip, in particular an optoelectronic semiconductor chip, is arranged on each chip landing area. In this case, each electronic semiconductor chip is electrically conductively connected to the second leadframe part of the respective quadrant. The electronic semiconductor chips may be light emitting diode chips (LED chips), for example. Advantageously, the electronic semiconductor chips are arranged very close to one another in this electronic component. If the electronic semiconductor chips are light emitting optoelectronic semiconductor chips, then this affords the advantage, for example, that light emitted by the individual optoelectronic semiconductor chips is emitted from starting points that are very close together, and is intermixed well as a result. The arrangement of the electronic semiconductor chips on the chip landing areas of the first leadframe parts and the electrically conductive connections between the electronic semiconductor chips and the second leadframe parts make it possible to electrically drive each electronic semiconductor chip via the first leadframe part and the second leadframe part of the respective quadrant of the leadframe section of the electronic component.

In one embodiment of the electronic component, chip edges of the electronic semiconductor chips are oriented substantially parallel to the outer edges of the chip landing areas. Advantageously, this results in a particularly compact and space-saving arrangement of the electronic semiconductor chips, which makes it possible for the electronic semiconductor chips of the electronic component to be arranged particularly close to one another.

In one embodiment of the electric component, a protective chip is arranged on a chip landing area of a quadrant, said protective chip being electrically conductively connected to the second leadframe part of the quadrant. The protective chip may be, for example, an ESD protective chip for protecting an electronic semiconductor chip arranged on the same chip landing area against damage as a result of electrostatic discharges. It is also possible to provide in each case a corresponding protective chip on the chip landing area of each quadrant of the leadframe section of the electronic component.

In one embodiment of the electronic component, the first leadframe part of the first quadrant is arranged between the second leadframe part of the first quadrant and the second leadframe part of the second quadrant. This has the advantage that the second leadframe parts of the first quadrant and of the second quadrant, which second leadframe parts are arranged at a lower temperature during the operation of the electronic component, are separated from one another by the first leadframe part of the first quadrant, which first leadframe part is at a higher temperature during the operation of the electronic component, as a result of which during the operation of the electronic component particularly large temperature gradients are established which enable an effective dissipation of waste heat from the first leadframe part of the first quadrant.

In one embodiment of the electronic component, the first leadframe part of the first quadrant is arranged between the second leadframe part of the first quadrant and the second leadframe part of the fourth quadrant. This has the advantage that the second leadframe parts of the first quadrant and of the fourth quadrant, which second leadframe parts are at a lower temperature during the operation of the electronic component, are separated from one another by the first leadframe part of the first quadrant, which first leadframe part is at a higher temperature during the operation of the electronic component, as a result of which during the operation of the electronic component particularly large temperature gradients arise which enable an effective dissipation of waste heat from the first leadframe part of the first quadrant.

A leadframe for producing an electronic component comprises a first leadframe section comprising a first quadrant, a second quadrant, a third quadrant and a fourth quadrant. Each of the quadrants comprises a first leadframe part and a second leadframe part. Each first leadframe part comprises a chip landing area for receiving an electronic semiconductor chip. The chip landing areas of all four quadrants are arranged adjacently to a common central region of the first leadframe section. Advantageously, the chip landing areas of the four quadrants of the first leadframe section of this leadframe are particularly close to one another, which, in the case of an electronic component produced from the first leadframe, enables a particularly dense arrangement of four electronic semiconductor chips on the four chip landing areas of the four quadrants of the first leadframe section.

In one embodiment of the leadframe, the latter comprises a second leadframe section and a third leadframe section, which are configured like the first leadframe section. Advantageously, the leadframe is thus suitable for the parallel production of a plurality of electronic components in common work processes. This advantageously enables a cost-effective production of electronic components.

In one embodiment of the leadframe, the first leadframe part of the first quadrant of the first leadframe section is configured integrally continuously with the first leadframe part of the third quadrant of the second leadframe section and with the second leadframe part of the fourth quadrant of the third leadframe section. Advantageously, this results in a high mechanical stability of the leadframe, which simplifies handling of the leadframe during the production of electronic components from the leadframe. In particular, the integrally continuous configuration of the leadframe parts of the leadframe sections of the leadframe prevents individual parts of the leadframe from being bent away or bent over during the processing of the leadframe.

In one embodiment of the leadframe, the second leadframe part of the first quadrant of the first leadframe section is configured integrally continuously with the first leadframe part of the second quadrant of the second leadframe section, with the second leadframe part of the second quadrant of the second leadframe section and with the second leadframe part of the fourth quadrant of the third leadframe section. Advantageously, this results in a mechanically stable configuration of the leadframe, thereby simplifying handling of the leadframe during the production of electronic components from the leadframe.

A method for producing an electronic component comprises steps for providing a leadframe of the type mentioned above, for embedding the first leadframe section into a housing, and for arranging in each case an electronic semiconductor chip, in particular an optoelectronic semiconductor chip, on the chip landing area of each first leadframe part of the first leadframe section. This method advantageously makes it possible to produce an electronic component comprising electronic semiconductor chips arranged very close to one another. In this case, the electronic semiconductor chips may be light emitting diode chips (LED chips), for example. In the case of an electronic component produced according to this method, the radiation emission faces of the light emitting diode chips are then advantageously very close to one another. On account of the mechanically robust geometry of the leadframe used in this method, the method is advantageously implementable in a particularly simple manner.

BRIEF DESCRIPTION OF THE DRAWINGS

The above-described properties, features and advantages of this invention and the way in which they are achieved will become clearer and more clearly understood in association with the following description of the exemplary embodiments which are explained in greater detail in association with the drawings. Here in a schematic illustration in each case.

DETAILED DESCRIPTION OF ILLUSTRATIVE EMBODIMENTS

Figure 1:
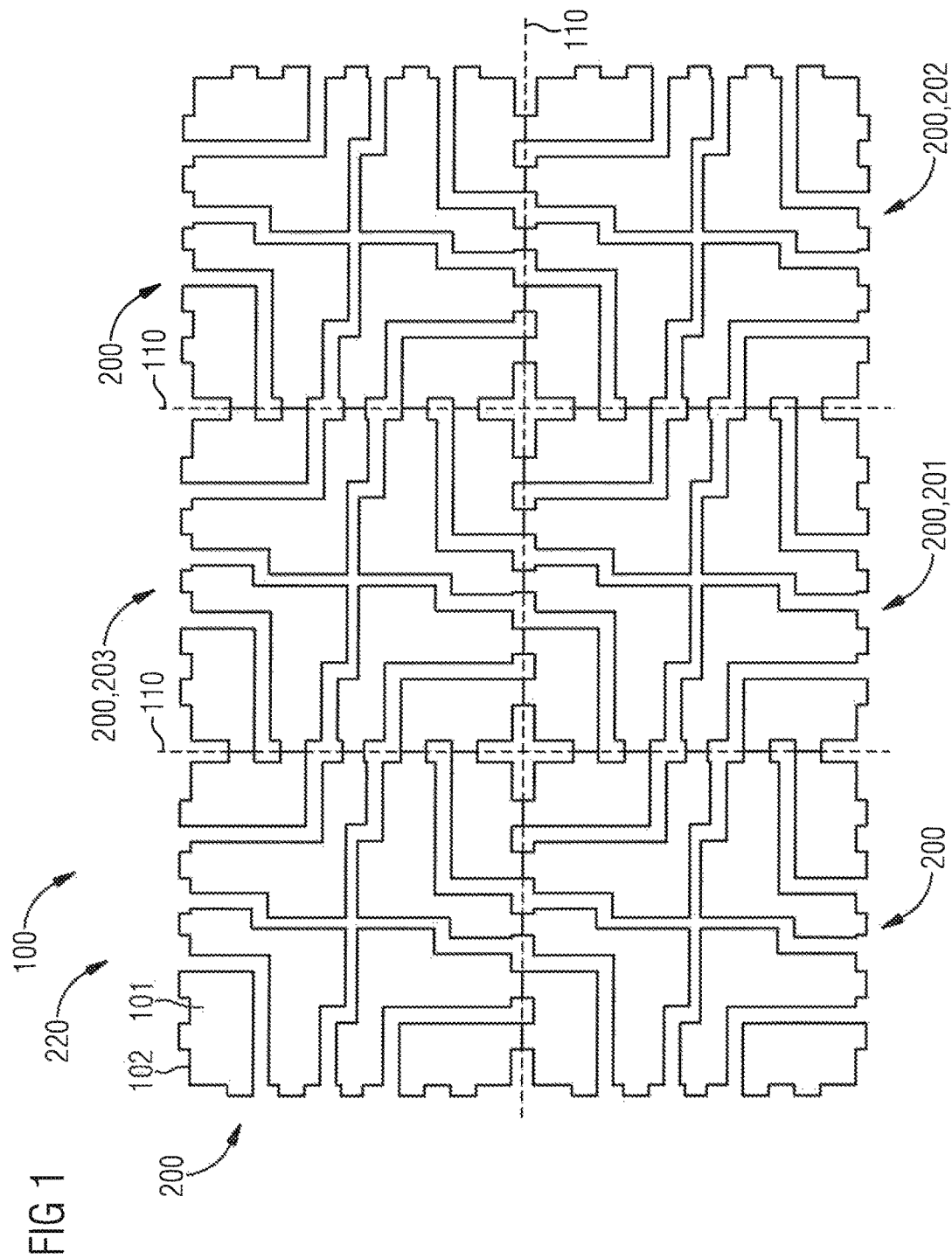
FIG. 1 shows a leadframe comprising a plurality of leadframe sections.

FIG. 1 shows a schematic plan view of a leadframe 100. The leadframe 100 is provided for producing a plurality of electronic components. By way of example, optoelectronic components, in particular light emitting diode components (LED components), for example, may be produced from the leadframe 100.

The leadframe 100 comprises an electrically conductive material, preferably a metal. The leadframe 100 is configured in the form of a substantially flat sheet comprising a top side 101 and an underside 102 opposite the top side 101. The leadframe 100 comprises cutouts extending between the top side 101 and the underside 102, which cutouts may be created, for example, by an etching method, an embossing method and/or a stamping method.

The leadframe 100 comprises a plurality of leadframe sections 200 configured in an identical way. In the example illustrated, the leadframe 100 comprises six leadframe sections 200. However, the leadframe 100 may also comprise a different number of leadframe sections 200, in particular a significantly larger number of leadframe sections 200.

The leadframe sections 200 of the leadframe 100 comprise in each case a substantially rectangular basic shape, preferably in particular a substantially square basic shape. The leadframe sections 200 of the leadframe 100 are arranged in a regular matrix arrangement and are connected to one another in a material-uniformly continuous fashion. A first leadframe section 200, 201 of the leadframe 100, for example, is connected to a second leadframe section 200, 202 of the leadframe 100 at a first side edge and to a third leadframe section 200, 203 of the leadframe 100 at a second side edge, perpendicular to the first side edge.

Figure 2:
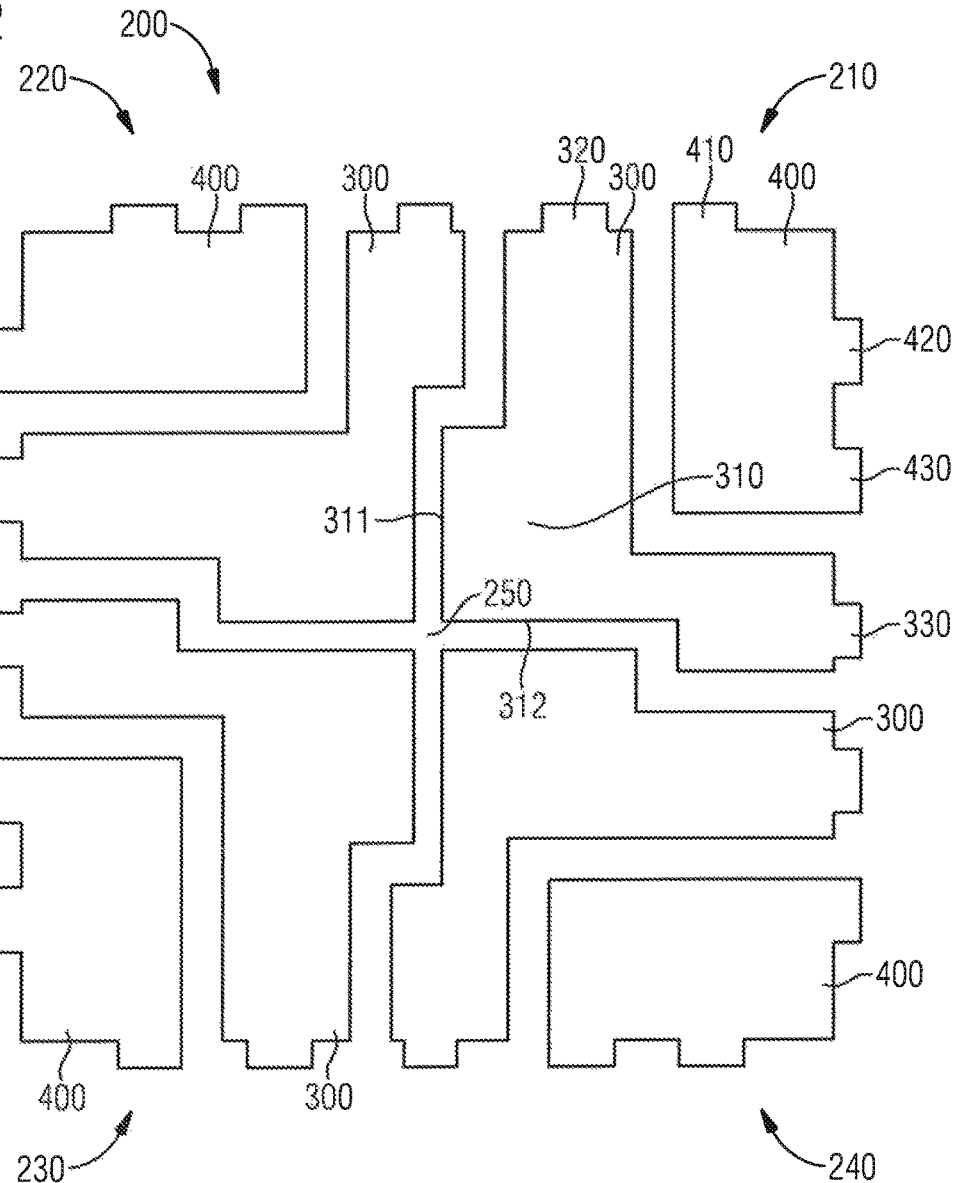
FIG. 2 shows an enlarged view of a leadframe section of the leadframe.

FIG. 2 shows an enlarged schematic view of an individual leadframe section 200 of the leadframe 100. The leadframe section 200 comprises a first quadrant 210, a second quadrant 220, a third quadrant 230 and a fourth quadrant 240. The quadrants 210, 220, 230, 240 of the leadframe section 200 are arranged around a central region 250 of the leadframe section 200.

The quadrants 210, 220, 230, 240 are configured symmetrically with respect to one another. In the example illustrated, the quadrants 210, 220, 230, 240 are configured rotationally symmetrically relative to a rotation around the central region 250 of the leadframe section 200 by an angle of 90° in each case. The second quadrant 220 is formed by a rotation of the first quadrant 210 by 90° around the central region 250. The third quadrant 230 is formed by a rotation of the second quadrant 220 by 90° around the central region 250. The fourth quadrant 240 is formed by a rotation of the third quadrant 230 by 90° around the central region 250. The first quadrant 210 is formed by a rotation of the fourth quadrant 240 by 90° around the central region 250.

It is possible to configure the quadrants 210, 220, 230, 240 additionally or alternatively mirror-symmetrically relative to a mirroring at a vertical axis extending through the central region 250 and a horizontal axis running through the central region 250.

Each of the quadrants 210, 220, 230, 240 of the leadframe section 200 comprises in each case a first leadframe part 300 and a second leadframe part 400. In the region of the leadframe section 200, neither the first leadframe part 300 and the second leadframe part 400 of a quadrant 210, 220, 230, 240 nor the leadframe parts 300, 400 of the different quadrants 210, 220, 230, 240 are connected to one another. Rather, all leadframe parts 300, 400 of the quadrants 210, 220, 230, 240 are separated from one another by cutouts provided in the leadframe 100. However, the leadframe parts 300, 400 of the quadrants 210, 220, 230, 240 of the leadframe section 200 are connected to one another in the assemblage of the leadframe 100 via the leadframe parts 300, 400 of other leadframe sections 200 of the leadframe 100, as a result of which the leadframe 100 is held together overall. This is discernible in FIG. 1.

The first leadframe parts 300 of the quadrants 210, 220, 230, 240 of the leadframe section 200 comprise in each case the basic shape of a bracket extending from two mutually perpendicularly oriented outer edges of the leadframe section 200 to the central region 250 of the leadframe section 200. As a result, the first leadframe part 300 of each quadrant 210, 220, 230, 240 in each case delimits a corner region of the respective quadrant 210, 220, 230, 240 arranged at a corner of the leadframe section 200. The second leadframe part 400 of the respective quadrant 210, 220, 230, 240 is arranged in said respective corner region.

This has the consequence that in each case regions of two first leadframe parts 300 of the leadframe section 200 are arranged between two second leadframe parts 400 of the leadframe section 200. By way of example, regions of the first leadframe part 300 of the first quadrant 210 and of the first leadframe part 300 of the second quadrant 220 are arranged between the second leadframe part 400 of the first quadrant 210 and the second leadframe part 400 of the second quadrant 220. Regions of the first leadframe part 300 of the first quadrant 210 and of the first leadframe part 300 of the fourth quadrant 240 are arranged between the second leadframe part 400 of the first quadrant 210 and the second leadframe part 400 of the fourth quadrant 240.

Each first leadframe part 300 of the leadframe section 200 comprises a chip landing area 310 arranged adjacently to the central region 250 of the leadframe section 200. The chip landing areas 310 of the first leadframe parts 300 of the leadframe section 200 are thus also directly adjacent to one another and separated from one another only by the cutouts arranged between the individual first leadframe parts 300 of the leadframe section 200. Each chip landing area 310 comprises a first outer edge 311 and a second outer edge 312, oriented perpendicularly to the first outer edge 311. The first outer edge 311 of the chip landing area 310 of the first leadframe part 300 of the first quadrant 210 is arranged parallel and directly adjacently to the second outer edge 312 of the chip landing area 310 of the first leadframe part 300 of the second quadrant 220. The second outer edge 312 of the chip landing area 310 of the first leadframe part 300 of the first quadrant 210 is arranged parallel and directly adjacently to the first outer edge 311 of the chip landing area 310 of the first leadframe part 300 of the fourth quadrant 240.

The chip landing areas 310 of the first leadframe parts 300 of the quadrants 210, 220, 230, 240 of the leadframe section 200 are provided for receiving electronic semiconductor chips. By way of example, optoelectronic semiconductor chips may be arranged on the chip landing areas 310 of the first leadframe parts 300 of the leadframe section 200, in particular light emitting diode chips (LED chips), for example.

The substantially bracket-shaped first leadframe parts 300 of the quadrants 210, 220, 230, 240 of the leadframe section 200 in each case comprise a first connection region 320 at an end region adjacent to a first outer edge of the leadframe section 200, and a second connection region 330 at an end region adjacent to a second outer edge of the leadframe section 200. The second leadframe parts 400 of the quadrants 210, 220, 230, 240 of the leadframe section 200 in each case comprise a third connection region 310 at an outer edge adjacent to the respective first outer edge of the leadframe section 200, and a fourth connection region 420 and a fifth connection region 430 at an outer edge adjacent to the respective second outer edge of the leadframe section 200.

In the example illustrated, the symmetry of the quadrants 210, 220, 230, 240 of the leadframe section 200 also extends to their connection regions 320, 330, 410, 420, 430. However, this is not absolutely necessary. The symmetry of the quadrants 210, 220, 230, 240 of the leadframe section 200 may also be limited to the other regions of the leadframe parts 300, 400 of the quadrants 210, 220, 230, 240.

Via the connection regions 320, 330, 410, 420, 430 the leadframe parts 300, 400 of each leadframe section 200 of the leadframe 100 are connected to leadframe parts 300, 400 of adjacent leadframe sections 200 of the leadframe 100, as is discernible in FIG. 1. The first leadframe part 300 of the first quadrant 210 of the first leadframe section 200, 201 of the leadframe 100 is connected integrally continuously to the first leadframe part 300 of the third quadrant 230 of the second leadframe section 200, 202, wherein the second connection region 330 of the first leadframe part 300 of the first quadrant 210 of the first leadframe section 200, 201 is connected to the second connection region 330 of the first leadframe part 300 of the third quadrant 230 of the second leadframe section 200, 202. Moreover, the first leadframe part 300 of the first quadrant 210 of the first leadframe section 200, 201 is connected, via its first connection region 320, integrally continuously to the fifth connection region 430 of the second leadframe part 400 of the fourth quadrant 240 of the third leadframe section 200, 203 of the leadframe 100. The second leadframe part 400 of the first quadrant 210 of the first leadframe section 200, 201 is connected, via its fifth connection region 430, integrally continuously to the first connection region 320 of the first leadframe part 300 of the second quadrant 220 of the second leadframe section 200, 202. Moreover, the second leadframe part 400 of the first quadrant 210 of the first leadframe section 200, 201 is connected, via its fourth connection region 420, integrally continuously to the third connection region 410 of the second leadframe part 400 of the second quadrant 220 of the second leadframe section 200, 202. Moreover, the second leadframe part 400 of the first quadrant 210 of the first leadframe section 200, 201 is connected, via its third connection region 410, integrally continuously to the fourth connection region 420 of the second leadframe part 400 of the fourth quadrant 240 of the third leadframe section 200, 203 of the leadframe 100.

The leadframe sections 200 of the leadframe 100 can be singulated by dividing the leadframe 100 along separating regions 110. In this case, the separating regions no extend through the connections between the connection regions 320, 330, 410, 420, 430 of the leadframe parts 300, 400 of the individual leadframe sections 200.

Figure 3:
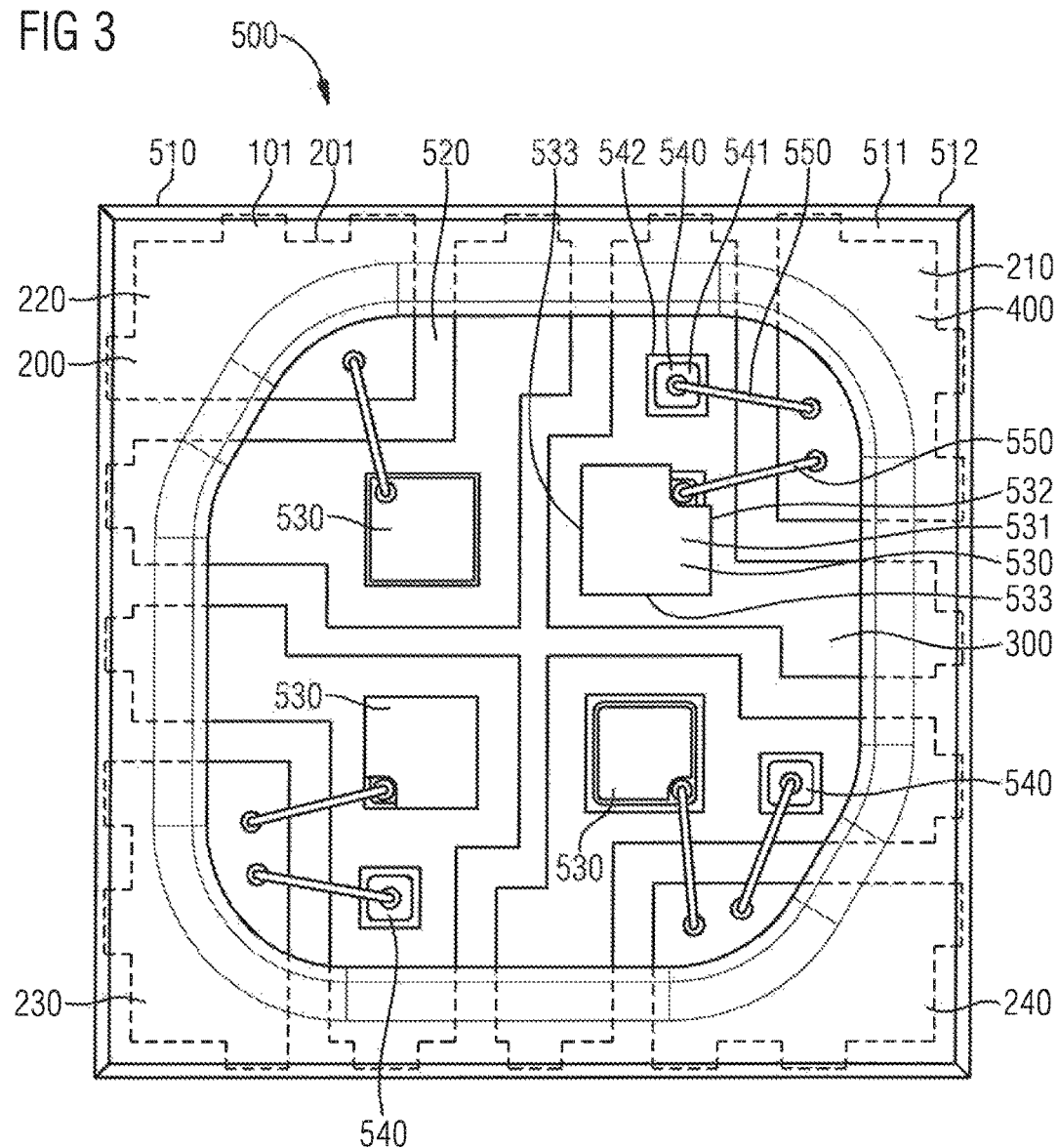
FIG. 3 shows a plan view of an electronic component comprising the leadframe section embedded into a housing.
Figure 4:
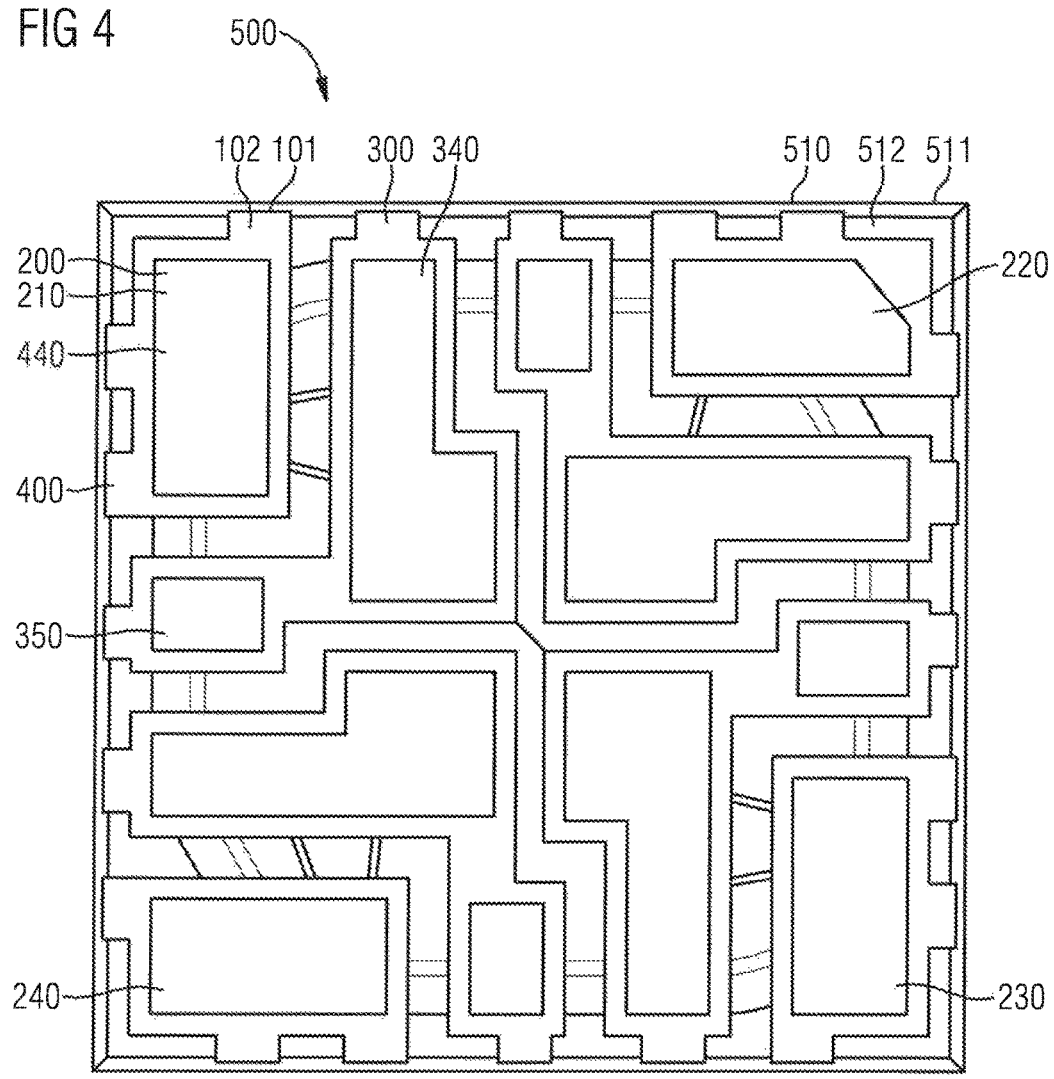
FIG. 4 shows a rear view of the electronic component.

FIG. 3 shows a schematic plan view of an electronic component 500. FIG. 4 shows a schematic view of an underside of the electronic component 500. The electronic component 500 may be, for example, an optoelectronic component, in particular a light emitting diode component (LED component), for example.

The electronic component 500 comprises one of the leadframe sections 200 of the leadframe 100. Moreover, the electronic component 500 comprises a housing 510 comprising a top side 511 and an underside 512 opposite the top side 511. A cavity 520 is configured at the top side 511 of the housing 510. The leadframe section 200 of the electronic component 500 is embedded into the housing 510 of the electronic component 500. In this case, the underside 102 of the leadframe section 200 is at least partly exposed at the underside 512 of the housing 510. The top side 101 of the leadframe section 200 of the electronic component 500 is at least partly exposed in the region of the cavity 520 at the top side 511 of the housing 510 of the electronic component 500.

The housing 510 comprises an electrically insulating material, for example, a plastics material. The housing 510 may be produced by a molding method, in particular by transfer molding, injection molding or compression molding, for example. In this case, the leadframe section 200 of the electronic component 500 is preferably already embedded into the housing 510 during the configuration of the housing 510 of the electronic component 500.

Particularly preferably, parallel production of a plurality of electronic components 500 may be carried out simultaneously. In this case, each leadframe section 200 of the leadframe 100 is embedded in each case into a housing 510 while the leadframe sections 200 of the leadframe 100 are still connected to one another. Afterward, the housings 510 and leadframe sections 200 of the individual electronic components 500 are divided jointly along the separating regions no in order to singulate the electronic components 500 thus formed.

The individual leadframe parts 300, 400 of the quadrants 210, 220, 230, 240 of the leadframe section 200 of the electronic component 500, which leadframe parts are no longer connected to one another and are electrically insulated from one another, are fixed and held together relative to one another by the housing 510 of the electronic component 500.

In the region of the cavity 520 at the top side 511 of the housing 510 of the electronic component 500, at least regions of all leadframe parts 300, 400 of all quadrants 210, 220, 230, 240 of the leadframe section 200 are not covered by the material of the housing 510. In particular, the chip landing areas 310 of the first leadframe parts 300 of the leadframe section 200 are also not covered by the material of the housing 510.

In each case an electronic semiconductor chip 530 is arranged on each chip landing area 310 of the leadframe section 200. The electronic semiconductor chips 530 in each case comprise a top side 531 and an underside 532 opposite the top side 531. The electronic semiconductor chips 530 are arranged on the chip landing areas 310 in such a way that the underside 532 of the electronic semiconductor chip 530 in each case faces the top side 101 of the chip landing area 310 of the first leadframe part 300 of the respective quadrant 210, 220, 230, 240 of the leadframe section 200. In this case, the underside 532 of the electronic semiconductor chip 530 may be connected to the respective chip landing area 310 by means of a soldering connection or some other chip bond connection, for example.

The electronic semiconductor chips 530 may be optoelectronic semiconductor chips, for example, which are configured for emitting or for absorbing electromagnetic radiation. In this case, the top sides 531 of the electronic semiconductor chips 530 may be radiation passage faces, for example, radiation emission faces. The electronic semiconductor chips 530 may be light emitting diode chips (LED chips), for example. In this case, wavelength-converting elements may optionally be arranged at the top sides 531 of the electronic semiconductor chips 530.

The electronic semiconductor chips 530 in each case comprise a substantially rectangular basic shape, for example, a substantially square shape. Chip edges 533 of the electronic semiconductor chips 530 here are in each case preferably oriented substantially parallel to the outer edges 311, 312 of the chip landing areas 310 of the first leadframe parts 300 of the leadframe section 200. As a result, the individual electronic semiconductor chips 530 of the electronic component 500 are arranged very close to one another.

The electronic semiconductor chip 530 of each quadrant 210, 220, 230, 240 of the electronic component 500 is electrically conductively connected to the respective first leadframe part 300 and to the respective second leadframe part 400. In the example illustrated, the electrically conductive connection between the electronic semiconductor chip 530 and the first leadframe part 300 is produced in each case via the chip bond connection between the underside 532 of the respective electronic semiconductor chip 530 and the top side 101 of the chip landing area 310 of the respective first leadframe part 300. The electrically conductive connection to the respective second leadframe part 400 is produced in each case by a bond wire 550 running from the top side 531 of the respective optoelectronic semiconductor chip 530 to the respective second leadframe part 400. However, it would also be possible, for example, also to produce the electrically conductive connection between the electronic semiconductor chip 530 and the first leadframe part 300 in each case via a bond wire.

The undersides 102 of the leadframe parts 300, 400 of the leadframe section 200 of the electronic component 500, which undersides are exposed at the underside of the electronic component 500, may serve for electrically contacting the electronic component 500. Each first leadframe part 300 of the leadframe section 200 of the electronic component 500 comprises a first soldering contact pad 340 and a third soldering contact pad 350 at the underside 102. In the example illustrated, the first soldering contact pad 340 and the third soldering contact pad 350 are configured as soldering regions spatially separated from one another, although this is not absolutely necessary. It is also possible, instead, to provide in each case only one continuous soldering contact pad at the undersides 102 of the first leadframe parts 300 of the quadrants 210, 220, 230, 240 of the leadframe section 200 of the electronic component 500. The undersides 102 of the second leadframe parts 400 of the quadrants 210, 220, 230, 240 of the leadframe section 200 of the electronic component 500 in each case comprise a second soldering contact pad 440. The soldering contact pads 340, 350, 440 of the electronic component 500 may serve for electrically contacting the electronic component 500 and the electronic semiconductor chips 530 thereof. The electronic component 500 may, for example, be configured as an SMD component and be provided for surface mounting, for example, for surface mounting by reflow soldering.

The electronic component 500 may comprise further chips in addition to the electronic semiconductor chips 530. In the example illustrated, the electronic component 500 comprises three protective chips 540, which are connected in parallel with the electronic semiconductor chips 530 on the first quadrant 210, the third quadrant 230 and the fourth quadrant 240 of the leadframe section 200 of the electronic component 500. The electronic semiconductor chip 530 arranged in the second quadrant 220 of the leadframe section 200 of the electronic component 500 comprises no protective chip 540 connected in parallel. It goes without saying, however, that a protective chip 540 may also be provided on the second quadrant 220 of the leadframe section 200 of the electronic component 500.

The protective chips 540 may be configured, for example, as ESD protective chips (electrostatic discharge) for protecting the electronic semiconductor chips 530 against damage as a result of electrostatic discharges.

Each protective chip 540 comprises a top side 541 and an underside 542 opposite the top side 541. The protective chips 540 are arranged on the first leadframe parts 300 of the respective quadrants 210, 230, 240 of the leadframe section 200 of the electronic component 500 in such a way that the undersides 542 of the protective chips 540 face the top sides 101 of the first leadframe parts 300 and are connected thereto by means of a chip bond connection, as a result of which an electrically conductive connection between the respective protective chip 540 and the respective first leadframe part 300 is also formed. A further electrically conductive connection is produced by means of a bond wire 550 between an electrical contact of the protective chip 540, said electrical contact being arranged at the top side 541 of the respective protective chip 540, and the respective second leadframe part 400 of the respective quadrant 210, 230, 240 of the leadframe section 200 of the electronic component 500.

A potting material may be arranged in the cavity 520 at the top side 511 of the housing 510 of the electronic component 500, said potting material covering the electronic semiconductor chips 530. As a result, the electronic semiconductor chips 530 are protected against damage as a result of external influences. If the electronic semiconductor chips 530 are light emitting optoelectronic semiconductor chips, then the potting material arranged in the cavity 520 may also comprise embedded wavelength-converting particles that are provided for converting a wavelength of an electromagnetic radiation emitted by the electronic semiconductor chips 530.

Figure 5:
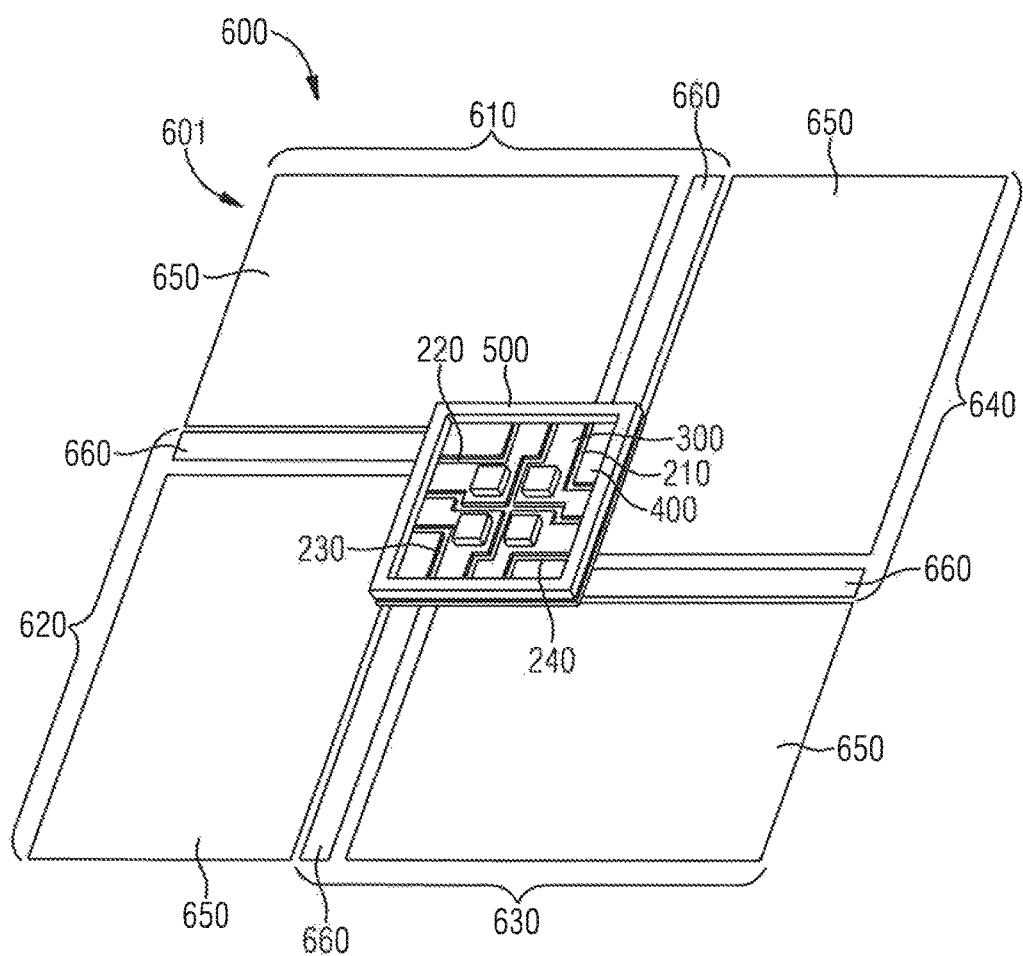
FIG. 5 shows a perspective illustration of a carrier with the electronic component arranged thereon.

FIG. 5 shows a schematic perspective illustration of a carrier 600 having a top side 601. The carrier 600 may be configured, for example, as a printed circuit board or as some other type of circuit carrier.

The electronic component 500 is arranged and electrically contacted at the top side 601 of the carrier 600. For the purpose of electrically contacting the electronic component 500, electrical contact pads are configured at the top side 601 of the carrier 600, said contact pads being subdivided into a first quadrant 610, a second quadrant 620, a third quadrant 630 and a fourth quadrant 640. Each quadrant 610, 620, 630, 640 comprises a first conductor track area 650 and a second conductor track area 660. The conductor track areas 650, 660 of all quadrants 610, 620, 630, 640 are electrically insulated from one another.

The electronic component 500 is arranged on the top side 601 of the carrier 600 in such a way that the underside 512 of the housing 510 of the electronic component 500 faces the top side 601 of the carrier 600. The soldering contact pads 340, 350, 440 of the electronic component 500, said soldering contact pads being arranged at the underside of the electronic component 500, are electrically conductively connected to the conductor track areas 650, 660 at the top side 601 of the carrier 600. The soldering contact pads 340, 350, 440 of the first quadrant 210 of the leadframe section 200 of the electronic component 500 are connected to the conductor track areas 650, 660 of the first quadrant 610 of the carrier 600. The soldering contact pads 340, 350, 440 of the second quadrant 220 of the leadframe section 200 of the electronic component 500 are electrically conductively connected to the conductor track areas 650, 660 of the second quadrant 620. The soldering contact pads 340, 350, 440 of the third quadrant 230 of the leadframe section 200 of the electronic component 500 are electrically conductively connected to the conductor track areas 650, 660 of the third quadrant 630 of the carrier 600. The soldering contact pad 340, 350, 440 of the fourth quadrant 240 of the leadframe section 200 of the electronic component 500 are electrically conductively connected to the conductor track areas 650, 660 of the fourth quadrant 650 of the carrier 600. Here in each case the first soldering contact pad 340 and the third soldering contact pad 350 of the first leadframe part 300 are connected to the first conductor track area 650 and the second soldering contact pad 440 of the second leadframe part 400 is connected to the second conductor track area 660.

Waste heat that arises in the electronic semiconductor chips 530 during the operation of the electronic component 500 can be dissipated into the carrier 600 via the first leadframe parts 300 of the leadframe section 200 of the electronic component 500 and the first conductor track areas 650 of the carrier 600.

As a result of the subdivision of the leadframe section 200 of the electronic component 500 into the quadrants 210, 220, 230, 240 and the subdivision of the top side 601 of the carrier 600 into the quadrants 610, 620, 630, 640, a dedicated complete quadrant is advantageously available for dissipating the waste heat of each electronic semiconductor chip 530 of the electronic component 500, which enables the waste heat to be effectively transported away from the electronic semiconductor chips 530. Advantageously, the thermal paths for dissipating the waste heat of the individual electronic semiconductor chips 530 are already separated in this case in the electronic component 500.

A further advantage is that first conductor track areas 650 and second conductor track areas 660, which will be in each case at different temperature levels during the operation of the electronic component 500, respectively alternate at the top side 601 of the carrier 600, as a result of which maximum temperature gradients are established, which enables a particularly effective dissipation of the waste heat from the electronic component 500.

The invention has been illustrated and described in more specific detail on the basis of the preferred exemplary embodiments. Nevertheless, the invention is not restricted to the examples disclosed. Rather, other variations may be derived therefrom by the person skilled in the art, without departing from the scope of protection of the invention.

The invention claimed is:

1. An electronic component comprising:
a housing; and
a leadframe section partly embedded in the housing,
wherein the leadframe section comprises a first quadrant, a second quadrant, a third quadrant and a fourth quadrant,
wherein each of the quadrants comprises a first leadframe part and a second leadframe part,
wherein each first leadframe part comprises a chip landing area,
wherein the chip landing areas of all four quadrants are arranged adjacently to a common central region of the leadframe section,
wherein the four quadrants are configured symmetrically with respect to one another, and
wherein all leadframe parts of all four quadrants are electrically isolated from one another.

2. The electronic component according to claim 1, wherein the four quadrants are configured rotationally symmetrically with respect to one another.

3. The electronic component according to claim 1, wherein the chip landing area of each first leadframe part comprises a first outer edge and a second outer edge, wherein the first outer edge of the first leadframe part of the first quadrant is arranged parallel and directly adjacently to the second outer edge of the first leadframe part of the second quadrant, and wherein the second outer edge of the first leadframe part of the first quadrant is arranged parallel and directly adjacently to the first outer edge of the first leadframe part of the fourth quadrant.

4. The electronic component according to claim 1, wherein in each case an optoelectronic semiconductor chip is arranged on each chip landing area, and wherein each optoelectronic semiconductor chip is electrically conductively connected to the second leadframe part of the respective quadrant.

5. The electronic component according to claim 4, wherein chip edges of the optoelectronic semiconductor chips are oriented substantially parallel to outer edges of the chip landing areas.

6. The electronic component according to any one of claim 1, further comprising a protective chip arranged on a chip landing area of a quadrant, the protective chip being electrically conductively connected to the second leadframe part of the quadrant.

7. The electronic component according to claim 1, wherein the first leadframe part of the first quadrant is arranged between the second leadframe part of the first quadrant and the second leadframe part of the second quadrant.

8. The electronic component according to claim 1, wherein the first leadframe part of the first quadrant is arranged between the second leadframe part of the first quadrant and the second leadframe part of the fourth quadrant.

9. A method for producing an electronic component, the method comprising:
providing a leadframe according to claim 1;
embedding the leadframe section into the housing; and
arranging, in each case, an optoelectronic semiconductor chip on the chip landing area of each first leadframe part of the leadframe section.

10. A leadframe comprising:
a first leadframe section comprising a first quadrant, a second quadrant, a third quadrant and a fourth quadrant; and
a second leadframe section and a third leadframe section, which have the same configuration as the first leadframe section,
wherein each of the quadrants comprises a first leadframe part and a second leadframe part,
wherein each first leadframe part comprises a chip landing area for receiving an electronic semiconductor chip,
wherein the chip landing areas of all four quadrants are arranged adjacently to a common central region of the first leadframe section,
wherein the four quadrants are configured symmetrically with respect to one another, and
wherein the first leadframe part of the first quadrant of the first leadframe section is configured integrally continuously with the first leadframe part of the third quadrant of the second leadframe section and with the second leadframe part of the fourth quadrant of the third leadframe section.

11. The leadframe according to claim 10, wherein the second leadframe part of the first quadrant of the first leadframe section is configured integrally continuously with the first leadframe part of the second quadrant of the second leadframe section, with the second leadframe part of the second quadrant of the second leadframe section and with the second leadframe part of the fourth quadrant of the third leadframe section.

12. A leadframe comprising:
a first leadframe section comprising a first quadrant, a second quadrant, a third quadrant and a fourth quadrant; and
a second leadframe section and a third leadframe section, which have the same configuration as the first leadframe section,
wherein each of the quadrants comprises a first leadframe part and a second leadframe part,
wherein each first leadframe part comprises a chip landing area for receiving an electronic semiconductor chip, wherein the chip landing areas of all four quadrants are arranged adjacently to a common central region of the first leadframe section,
wherein the four quadrants are configured symmetrically with respect to one another,
wherein the second leadframe part of the first quadrant of the first leadframe section is configured integrally continuously with the first leadframe part of the second quadrant of the second leadframe section, with the second leadframe part of the second quadrant of the second leadframe section and with the second leadframe part of the fourth quadrant of the third leadframe section.

\* \* \* \* \*